(12) United States Patent
Knorr et al.

(10) Patent No.: US 9,257,325 B2
(45) Date of Patent: Feb. 9, 2016

(54) SEMICONDUCTOR STRUCTURES AND METHODS FOR FORMING ISOLATION BETWEEN FIN STRUCTURES OF FINFET DEVICES

(75) Inventors: Andreas Knorr, Wappingers Falls, NY (US); Frank Scott Johnson, Wappingers Falls, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 1713 days.

(21) Appl. No.: 12/562,849

(22) Filed: Sep. 18, 2009

(65) Prior Publication Data

US 2011/0068431 A1  Mar. 24, 2011

(51) Int. Cl.
- *H01L 29/06* (2006.01)
- *H01L 21/762* (2006.01)
- *H01L 29/66* (2006.01)
- *H01L 29/78* (2006.01)

(52) U.S. Cl.
CPC .... *H01L 21/76229* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 6,004,856 A * | 12/1999 | Mazure-Espejo et al. | 438/396 |
| 6,642,090 B1 * | 11/2003 | Fried et al. | 438/164 |
| 6,689,650 B2 * | 2/2004 | Gambino et al. | 438/157 |
| 2004/0150029 A1 | 8/2004 | Lee | |
| 2008/0048186 A1 | 2/2008 | Cheng et al. | |
| 2008/0073723 A1 * | 3/2008 | Rachmady et al. | 257/369 |
| 2009/0008705 A1 * | 1/2009 | Zhu et al. | 257/327 |
| 2010/0044787 A1 * | 2/2010 | Sugioka | 257/331 |

FOREIGN PATENT DOCUMENTS

TW  559947 B  11/2003

OTHER PUBLICATIONS

The Intellectual Property Office, Decision Letter for Taiwanese Patent Application No. 099131581 dated Aug. 20, 2015.
Intellectual Property Office, Examination Report for Taiwanese Patent Application No. 099131581 mailed Jan. 21, 2015.

* cited by examiner

*Primary Examiner* — Hrayr A Sayadian
(74) *Attorney, Agent, or Firm* — Ingrassia Fisher & Lorenz, P.C.

(57) ABSTRACT

Semiconductor structures and methods for forming isolation between fin structures formed from a bulk silicon wafer are provided. A bulk silicon wafer is provided having one or more fin structures formed therefrom. Forming of the fin structures defines isolation trenches between the one or more fin structures. Each of the fin structures has vertical sidewalls. An oxide layer is deposited in the isolation trenches and on the vertical sidewalls using HDPCVD in about a 4:1 ratio or greater. The oxide layer is isotropically etched to remove the oxide layer from the vertical sidewalls and a portion of the oxide layer from the bottom of the isolation trenches. A substantially uniformly thick isolating oxide layer is formed on the bottom of the isolation trench to isolate the one or more fin structures and substantially reduce fin height variability.

13 Claims, 2 Drawing Sheets

—PRIOR ART—

SEMICONDUCTOR STRUCTURES AND METHODS FOR FORMING ISOLATION BETWEEN FIN STRUCTURES OF FINFET DEVICES

FIELD OF THE INVENTION

The present invention generally relates to semiconductor structures and methods for fabricating semiconductor structures, and more particularly relates to methods for fabricating bulk FinFET devices having shallow trench isolation (STI).

BACKGROUND OF THE INVENTION

In contrast to traditional planar metal-oxide-semiconductor field-effect transistors (MOSFETS), which are fabricated using conventional lithographic fabrication methods, nonplanar FETs (field-effect transistors) incorporate various vertical transistor structures, and typically include two or more gate structures formed in parallel. One such semiconductor structure is the "FinFET" which takes its name from the multiple thin silicon "fins" that are used to form the respective gate channels, and which are typically on the order of tens of nanometers in width.

More particularly, referring to the exemplary prior art nonplanar MOS transistor having a FinFET configuration shown in FIG. 1, a FinFET device 10 generally includes two or more parallel silicon fin structures (or simply "fins") 12. However, it is to be appreciated that the FinFET device may include just one silicon fin structure.

The fins extend between a common source electrode and a common drain electrode (not shown in FIG. 1). A conductive gate structure 16 "wraps around" three sides of both fins, and is separated from the fins by a standard gate insulator layer 18. Fins may be suitably doped to produce the desired FET polarity, as is known in the art, such that a gate channel is formed within the near surface of the fins adjacent to the gate insulator 18.

The fin structures (and thus FinFET devices) may be formed on a semiconductor substrate. The semiconductor substrate may be a bulk silicon wafer from which the fin structures are formed or may comprise a silicon on insulator (SOI) wafer disposed on a support substrate. The SOI wafer comprises a silicon oxide layer, and a silicon-comprising material layer overlying the silicon oxide layer. The fin structures are formed from the silicon-comprising material layer. Fin structures are typically formed using conventional photolithographic or anisotropic etching processes (e.g., reactive ion etching (RIE) or the like).

Electrical isolation of the fin structures is necessary in order to avoid electromechanical interference (EMI) and/or parasitic leakage paths between the various devices. Isolating fin structures on a bulk silicon wafer is especially problematic as the silicon of the bulk silicon wafer between the fin structures forms a conduction path. Shallow trench isolation (STI) is a technique used to electrically isolate transistors or electrical devices. Typical STI is created early during the semiconductor device fabrication process, before the transistors are formed. A conventional STI process involves creating an isolation trench in the semiconductor substrate through an anisotropic etch process (such as reactive ion etching (RIE)), and depositing one or more dielectric filler materials (such as silicon oxide) using chemical vapor deposition (CVD) processes to fill the isolation trenches. The deposited dielectric material may then be planarized by a Chemical-Mechanical Polishing (CMP) process that removes the excess dielectric and creates a planar STI structure. In FinFET devices, this planarized oxide then needs to be etched back to form a 5 nm to 20 nm uniformly thick oxide isolation between the fin structures and expose the fin vertical sidewalls for further processing. This conventional technique is difficult to control, often resulting in a dielectric layer that varies in thickness. In addition, more dielectric filler material than is needed to provide isolation is required to be deposited in order to permit etch back (planarization).

In addition, the isolation area on the exposed semiconductor substrate between each fin structure (hereinafter "isolation trench") has a high aspect ratio. Aspect ratio is the ratio of the depth of the opening to its width. The filling of high aspect ratio isolation trenches is difficult. Even state of the art oxide chemical vapor deposition (CVD) processes such as advanced high density plasma (HDP) or ozone based TEOS (tetraethylorthosilicate) processes cannot reliably fill these high aspect ratio isolation trenches. This causes problems in controlling and creating electrical isolation in FinFET devices.

Additionally, bulk silicon wafers lack an etch stop layer upon which etching of the fin can terminate. Without this etch stop layer, variability in the etch depth results in variability in the fin height. As the amount of current conducted by the FinFET device is proportional to the height of the fin, it is important to minimize variability in the fin height.

Accordingly, it is desirable to provide methods for forming isolation between fin structures of FinFET devices. In addition, it is desirable to provide methods for controllable filling of the high aspect ratio isolation trenches between the fin structures, with fewer process steps, with less dielectric filler material, and which result in less fin height variability for bulk FinFETs. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods are provided for forming a FinFET device in a semiconductor substrate. In accordance with one exemplary embodiment, a method for forming the FinFET device comprises forming one or more fin structures from the semiconductor substrate. The fin structures include vertical sidewalls. The step of forming the one or more fin structures defines isolation trenches on the exposed semiconductor substrate between the one or more fin structures. An oxide layer is deposited in the bottom of the isolation trenches and on the vertical sidewalls of the one or more fin structures using a high density plasma chemical vapor deposition (HDPCVD) process. The oxide layer in the bottom of the isolation trenches has a greater thickness than the oxide layer on the vertical sidewalls. The oxide layer is then removed from the vertical sidewalls and at least a portion is removed from the isolation trenches to form a substantially uniformly thick isolating oxide layer in the isolation trenches.

In accordance with another exemplary embodiment, a method for forming isolation between fin structures formed from a bulk silicon wafer comprises the step of providing a bulk silicon wafer having one or more fin structures formed therefrom with isolation trenches between the one or more fin structures and each of the fin structures having vertical sidewalls. An oxide layer is deposited in the bottom of each of the isolation trenches of the bulk silicon wafer and on the vertical sidewalls of the one or more fin structures using a high density plasma chemical vapor deposition (HDPCVD) process. The oxide layer is isotropically etched from the vertical sidewalls and at least a portion thereof is isotropically etched from the isolation trenches to form an isolating oxide layer in the bottom of the isolation trenches of substantially uniform thickness that forms isolation between the fin structures and substantially reduces fin height variability.

Semiconductor structures including bulk FinFET devices having shallow trench isolation between one or more fin structures are also provided. The bulk FinFET devices comprise a bulk silicon wafer having one or more fin structures, each of the one or more fin structures including vertical sidewalls. A trench is located on the bulk silicon wafer between each of the one or more fin structures. A substantially uniformly thick layer of high density plasma (HDP) oxide in the bottom of the trench forms shallow trench isolation and defines fin structures of substantially uniform height.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Methods in accordance with exemplary embodiments of the present invention are provided for forming isolation between one or more previously-formed fin structures 12 on a bulk silicon wafer 20. The step of forming the one or more fin structures defines isolation trenches 22 on the exposed bulk silicon wafer 20 between the one or more previously-formed fin structures. The fin structures 12 include vertical sidewalls.

Fin structures are typically formed using conventional photolithographic or anisotropic etching processes (e.g., reactive ion etching (RIE) or the like), however, it will be understood that the present invention is not limited to any particular manner of forming the fin structures of a FinFET device. For example, as known in the art, the step of forming the one or more fin structures may include fabricating mandrels (not shown) and sidewall spacers 28 adjacent the sidewalls of the mandrels, removing the mandrels, and etching the bulk silicon wafer 20 to form the one or more fin structures 12 therefrom using the sidewall spacers 28 as an etch mask. The methods as described herein according to exemplary embodiments may be applied to any type of FinFET fabrication process.

Figure 2:
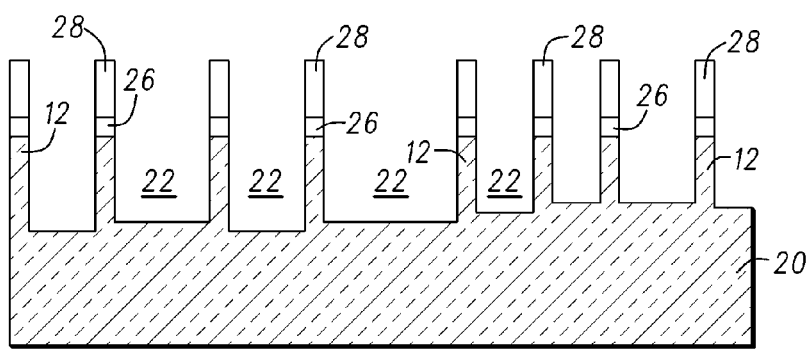
FIG. 2 illustrates, in cross section, a bulk silicon wafer from which fin structures have been previously formed with isolation trenches between the fin structures.
Figure 3:
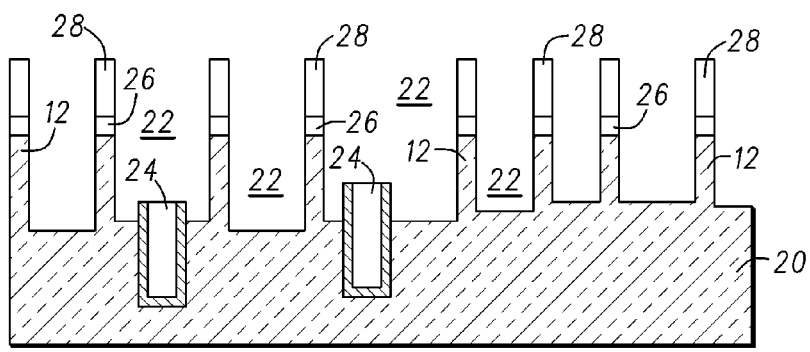
FIG. 3 illustrates, in cross section, the bulk silicon wafer of FIG. 2 with previously-formed deep isolation trenches.

As used herein, a "bulk silicon wafer" comprises a monolithic block of single crystal silicon. FIG. 2 illustrates, in cross-section, a bulk silicon wafer 20 following formation of a plurality of fin structures 12 therefrom. FIG. 3 is similar to FIG. 2 except that the bulk silicon wafer 20 includes previously-formed and filled deep isolation trenches therein 24. As shown in FIGS. 2 and 3, fin height prior to isolation varies across the bulk silicon wafer. The top of the fin structures 12 may include a portion of a pad silicon oxide layer 26 and sidewall spacers 28 that remain after previously being used to form the fin structures and will be used to protect the fin structures during isolation formation and also act as isolation between gate structures in the case of double gate FinFET devices. In the case of triple gate FinFET devices, the pad silicon oxide layer and sidewall spacer portions at the top of the fin structures will be removed during subsequent processing as hereinafter described. A FinFET device formed from a bulk silicon wafer is referred to herein as a "bulk FinFET device."

Figure 4:
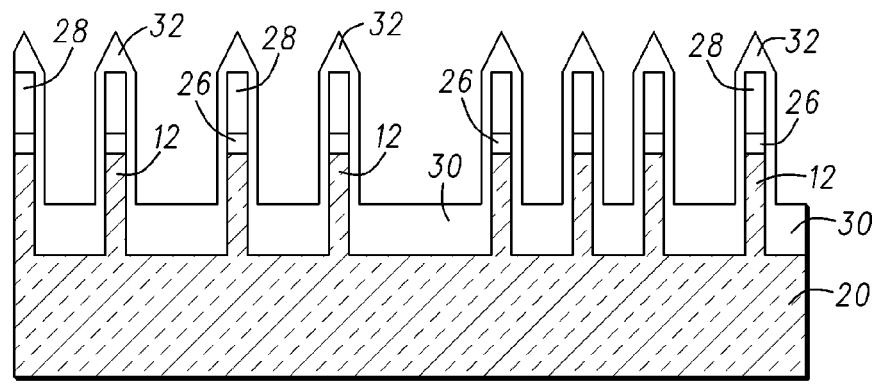
FIGS. 4-5 illustrate, in cross section, methods for forming isolation between fin structures of a bulk FinFET device, in accordance with exemplary embodiments of the present invention.

In accordance with an exemplary embodiment of the present invention, as shown in FIG. 4, a method of forming isolation between the one or more fin structures 12 on a bulk silicon wafer 20 as shown in FIG. 2 or 3 comprises the step of depositing oxide to form an oxide layer 30 in the bottom of the isolation trenches 22 of the bulk silicon wafer, and on the vertical sidewalls of the fin structures 12, pad silicon oxide layer 26 and sidewall spacers 28 using high density plasma chemical vapor deposition (HDP-CVD or simply HDP). The HDP-CVD process comprises depositing material on the substrate (in this case, the bulk silicon wafer 20) typically in a mixture of silane, oxygen and an inter gas (argon and/or helium) at pressures below 50 m Torr in a capacitively coupled high density plasma environment. Hydrogen or other species might also be supplied. Plasma power is typically supplied to coils in the dome above and to the wafer chuck itself. Plasma power is ratioed to achieve deposition to etch ratios in the regime of 2:1 up to 6:1. For this particular application of HDPCVD, the deposition rates are below 100 nm per minute to achieve precise control of thickness and uniformity.

The HDP deposition process characteristically deposits more oxide on the horizontal exposed surfaces than on the vertical surfaces. The HDP deposition process characteristically also causes a cap oxide layer 32 to be formed over the top of the sidewall spacers. Therefore, more oxide is deposited in the bottom of the isolation trenches than on the vertical sidewalls. The thickness of the oxide layer at the bottom of the isolation trenches is greater than the thickness of the oxide layer on the vertical sidewalls, typically in about a 4:1 ratio or greater. The desired topography/profile of the structure after oxide deposition is as shown in FIG. 4.

The oxide layer may be made of, for example, silicon dioxide ($SiO_2$). In some embodiments, the oxide layer may be made of, for example, a low-k dielectric material, e.g., SiCOH, SiC, SiCN, SiN, other dielectric material or combinations thereof.

The HDP deposition process provides an oxide layer 30 with improved high aspect ratio trench fill capabilities as compared to other deposition processes. HDP deposition also provides improved gap-fill characteristics due to the occurrence of sputtering, promoted by the plasma's high density, simultaneous with layer deposition. The sputtering element of HDP deposition takes place simultaneously with the deposition and slows deposition on certain features, such as on the vertical sidewalls of the fin structures. Therefore, using HDPCVD enables the controlled deposition of oxide in the high aspect ratio isolation trenches 22 to a desired thickness without having to overfill the isolation trenches with oxide and etch back as in the conventional shallow trench isolation (STI) process. Depositing the oxide layer with a moderate to low sputter to deposition ratio results in a vertical sidewall to bottom coverage thickness ratio of about 1:5.

In alternative embodiments, other deposition processes and materials may be used to create a topography/profile similar to that shown in FIG. 4. For example, other high density plasma (HDP) or plasma promoted processes that utilize isotropic etch components in addition (or in lieu) of the in-situ sputtering in conventional HDPCVD SiO$_2$ deposition.

Figure 5:
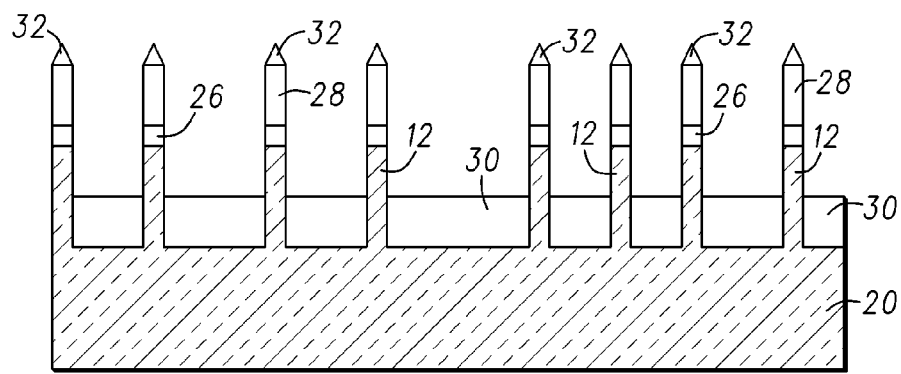

Next, in accordance with an exemplary embodiment of the present invention, the method of forming isolation between the one or more fin structures includes the step of removing oxide from the vertical sidewalls and at least a portion of the oxide layer 30 in the bottom of the isolation trenches 22 to form an "isolating oxide layer" in the bottom of the isolation trenches that has a substantially uniform thickness, as shown in FIG. 5. The step of removing the oxide comprises isotropically etching the oxide layer. The term "isolating oxide layer" refers to the substantially uniformly thick oxide layer at the bottom of the isolation trench(es) following the oxide deposition and etching steps. The isolating oxide layer may have a thickness from about 5 to about 15 nm thick. The oxide layer at the bottom of the isolation trenches has a greater thickness than any remaining oxide layer on the vertical sidewalls.

In a preferred embodiment, the step of isotropically etching the oxide layer comprises using a highly controllable and precise chemical oxide removal process, such as a chemical oxide removal (COR) process, a Siconi™ dry chemical etch process, or a chemical oxide removal process using dilute and buffered hydrofluoric acid. The COR process selectively etches exposed surfaces of the oxide layer. The COR process generally includes exposing surfaces of the oxide layer 30 to process gases, and heat treating the chemically treated oxide surface layer. The COR process comprises exposing the structure of FIG. 4 to a gaseous or vaporous mixture of HF and ammonia at a pressure of about 30 mTorr or below, preferably at a pressure from about 1 mTorr to about 30 mTorr. It is preferable to set a flow rate of the ammonia gas to be greater than that of the hydrogen fluoride gas, typically at a ratio of 3:1. The COR process is typically performed at a temperature that is about nominal room temperature (20° C. to about 40° C.), with a temperature of about 25° C. being even more typical. By performing the COR process in which the processing gas reacts with the deposited oxide layer, a volatile gas component and volatile complex compound are generated.

A heat treatment as known in the art may then be performed by heating the structure that has been subjected to the COR process. The volatile complex compound is thermally decomposed into volatile gas components to be completely volatilized and, then, removed from the substrate. The structure is preferably heated in the range of about 80° C. to about 200° C., for example. As described above, in accordance with this embodiment, the COR process and the heat treatment are sequentially performed in removing the oxide layer from the vertical sidewalls of the fin structures and removing at least a portion of the oxide layer from the horizontal surface of the bulk silicon wafer 20.

The oxide layer may also be removed using an isotropic etching process including but not limited to, a dry chemical etching process using a vacuum chamber, such as a Siconi™ chamber available from Applied Materials Inc. of Santa Clara, Calif. The process selectively removes deposited oxide through a low-temperature, two-step dry chemical etch process. Generally, the first step uses a remote plasma source to generate the NH$_4$F etchant species from NF$_3$ and NH$_3$ to minimize damage to the semiconductor substrate. The etchant species are introduced into a chamber and condensed into a solid by-product on the cooled bulk silicon wafer surface through a reaction with the oxide layer 30. In the second step, an in-situ anneal is performed to decompose the by-product using convection and radiation heating. As the residue sublimates, it is removed by radial gas flow from the bulk silicon wafer surface and pumped out of the chamber, leaving behind a clean bulk silicon wafer ready for further fabrication into a FinFET device. The process provides a highly selective dry chemical clean for removing oxide from silicon without surface damage and with stable etch uniformity.

Alternatively, the step of isotropically etching the oxide layer comprises wet etching the oxide layer with a liquid etchant. Common liquid etchants include hydrofluoric acid (HF) (usually diluted with water or buffered and diluted with ammonium fluoride) or the like.

During the isotropic etching step, oxide is removed from both the vertical sidewalls and at least a portion from the isolation trench(es). However, as removal of oxide with chemical oxide removal processes such as the COR and SICONI™ processes and with a wet etchant such as HF is very controllable and the initial oxide layer thickness on the bottom of the isolation trench(es) 22 far exceeds the initial thickness of the oxide layer on the vertical sidewalls, the thickness of the isolating oxide layer at the bottom of the trench is sufficient for lateral isolation between the one or more fin structures.

These well-controlled isotropic oxide etching processes result in about a four-fold reduction of STI height (i.e., isolating oxide layer thickness) variation from bulk silicon wafer edge to center and across the fin structures as compared to conventional etch back techniques. The thickness of the isolating oxide layer at the bottom of the isolation trenches is substantially uniform and the height of the fin structures above the isolating oxide layer substantially uniform i.e., fin height variability is substantially reduced as shown in FIG. 5. The ability to reduce fin height variability in bulk FinFET devices is particularly important as the amount of current conducted by the FinFET device is proportional to the height of the fin.

Figure 1:
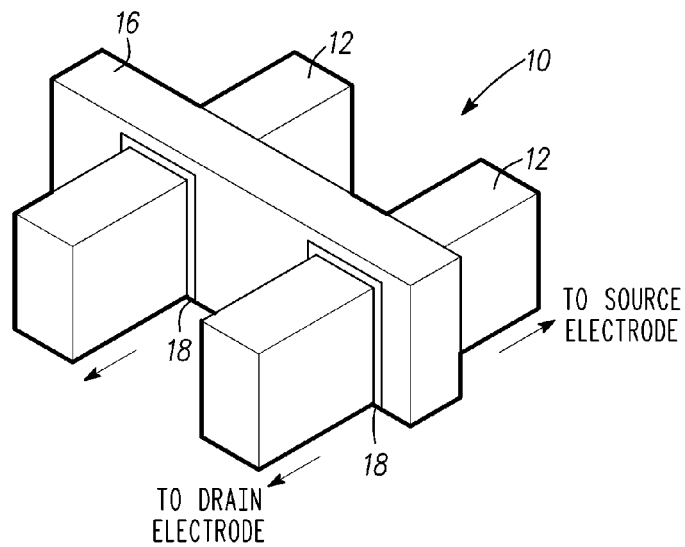
FIG. 1 is an isometric schematic view of an exemplary FinFET structure available in the prior art.

After forming isolation between the fin structures as described above, the pad silicon oxide layer 26, sidewall spacer 28, and cap oxide layer on the top of a fin structure may be removed by conventional processes (not shown), such as in the case of triple gate FinFET devices. Thereafter, conventional fabrication processing can then be performed to complete the FinFET device as illustrated in FIG. 1. A gate insulator 18 is formed overlying the one or more fin structures 12 and a gate electrode forming material such as polycrystalline silicon is deposited over the gate insulator. The gate electrode forming material is patterned to form at least one gate electrode 16 as is known in the art. The gate electrode is then used as an ion implantation mask and conductivity determining ions are implanted into exposed portions of the fin structures in self alignment with the gate electrode to form the source and drain regions (not shown in FIG. 1). As those of skill in the art will appreciate, the ion implantation mask may also include sidewall spacers formed on the sides of the gate electrodes and multiple ion implantations may be used to form the source and drain electrodes.

While isolation between one or more fin structures on a bulk silicon wafer has been described, the invention is not so limited. Fin structures on a silicon-on insulator (SOI) wafer may be isolated in the same manner. Although not illustrated, isolation trenches 22 may be formed between one or more fin structures on a SOI wafer.

From the foregoing, it is to be appreciated that FinFET devices may be formed with electrical isolation between the fin structures, improved uniformity in the thickness of the isolating oxide layer which enables greater fin height uniformity which is important for FinFET devices, using less material, with more control, and fewer processing steps.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a finFET device in a semiconductor substrate comprising the steps of:
   forming fin structures from the semiconductor substrate, the fin structures including vertical sidewalls, the step of forming the fin structures defining isolation trenches on the exposed semiconductor substrate between the fin structures;
   depositing an oxide to form an oxide layer on horizontal exposed surfaces in the bottom of the isolation trenches and on vertical surfaces of the vertical sidewalls of the fin structures with the oxide layer in the bottom of the isolation trenches having a greater thickness than the oxide layer on the vertical sidewalls; and
   removing the oxide layer from the vertical sidewalls and at least a portion from the isolation trenches to form a uniformly thick isolating oxide layer in the isolation trenches.

2. The method of claim 1, wherein the semiconductor substrate comprises a bulk silicon wafer.

3. The method of claim 2, wherein the step of depositing the oxide layer in the bottom of the isolation trenches comprises depositing more oxide on the horizontal surface of the exposed bulk silicon wafer between the fin structures than on the vertical sidewalls of the fin structures in about a 4:1 ratio or greater.

4. The method of claim 3, wherein the step of depositing the oxide layer comprises using a high density plasma chemical vapor deposition (HDPCVD) process with a moderate to low sputter to deposition ratio resulting in a vertical sidewall to bottom coverage thickness ratio of 1:5.

5. The method of claim 1, wherein the thickness of the isolating oxide layer at the bottom of the isolation trenches comprises from about 5 to about 15 nm.

6. The method of claim 1, wherein the step of removing oxide comprises isotropically etching the oxide layer from the vertical sidewalls and a portion of the oxide layer from the isolation trenches.

7. The method of claim 6, wherein the step of isotropically etching the oxide layer comprises using a chemical oxide removal process.

8. A method for forming isolation between fin structures formed from a bulk silicon wafer comprising the steps of:
   providing a bulk silicon wafer having fin structures formed therefrom with isolation trenches between the fin structures and each of the fin structures having vertical sidewalls;
   depositing an oxide to form an oxide layer in the bottom of each of the isolation trenches of the bulk silicon wafer and on the vertical sidewalls of the fin structures using a high density plasma chemical vapor deposition (HD-PCVD) process; and
   isotropically etching the oxide layer from the vertical sidewalls and at least a portion of the oxide layer in each of the isolation trenches to form an isolating oxide layer in the bottom of the isolation trenches of uniform thickness that forms isolation between the fin structures and reduces the variability in the height of the fin structures above the isolating oxide layer.

9. The method of claim 8, wherein the step of depositing the oxide layer comprises depositing more oxide on a horizontal surface of the exposed bulk silicon wafer than on the vertical sidewalls of the fin structures in about a 4:1 ratio or greater.

10. The method of claim 8, wherein the thickness of the isolating oxide layer comprises from about 5 to about 15 nm.

11. The method of claim 8, wherein the step of isotropically etching the oxide layer comprises using a chemical oxide removal process.

12. A bulk FinFET device having shallow trench isolation between fin structures, comprising:
   a bulk silicon wafer having fin structures, each of the fin structures including vertical sidewalls;
   a trench located on the bulk silicon wafer between each of the fin structures; and
   a uniformly thick layer of high density plasma (HDP) oxide in the bottom of the trench forming shallow trench isolation and defining fin structures of uniform height.

13. The method of claim 1, wherein a top of the fin structures includes a portion of a pad silicon oxide layer and sidewall spacers, and wherein depositing the oxide comprises depositing the oxide to form the oxide layer in the bottom of the isolation trenches of the bulk silicon wafer and on the vertical sidewalls of the fin structures, pad silicon oxide layer and sidewall spacers.

* * * * *